(12) United States Patent
Chen et al.

(10) Patent No.: US 8,253,217 B2
(45) Date of Patent: Aug. 28, 2012

(54) SEAL RING STRUCTURE IN SEMICONDUCTOR DEVICES

(75) Inventors: Hsien-Wei Chen, Sinying (TW); Chung-Ying Yang, Taoyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 160 days.

(21) Appl. No.: 12/816,454

(22) Filed: Jun. 16, 2010

(65) Prior Publication Data
US 2011/0309465 A1 Dec. 22, 2011

(51) Int. Cl.
*H01L 23/52* (2006.01)
*H01L 21/76* (2006.01)
(52) U.S. Cl. ........................ 257/503; 438/400
(58) Field of Classification Search ............. 257/620, 257/503; 438/400
See application file for complete search history.

(56) References Cited

U.S. PATENT DOCUMENTS

| 6,492,716 B1 * | 12/2002 | Bothra et al. ............. 257/678 |
| 6,537,849 B1 | 3/2003 | Tsai et al. |
| 7,554,202 B2 * | 6/2009 | Koubuchi et al. ......... 257/776 |
| 2010/0052065 A1 * | 3/2010 | Diaz et al. ............. 257/369 |

* cited by examiner

*Primary Examiner* — Julio J Maldonado
*Assistant Examiner* — Robert Bachner
(74) *Attorney, Agent, or Firm* — Haynes and Boone, LLP

(57) ABSTRACT

The present disclosure provides a semiconductor device that includes a substrate having a seal ring region and a circuit region, a plurality of dummy gates disposed over the seal ring region of the substrate, and a seal ring structure disposed over the plurality of dummy gates in the seal ring region. A method of fabricating a semiconductor device is also provided, the method including providing a substrate having a seal ring region and a circuit region, forming a plurality of dummy gates over the seal ring region of the substrate, and forming a seal ring structure over the plurality of dummy gates over the seal ring region.

20 Claims, 7 Drawing Sheets

SEAL RING STRUCTURE IN SEMICONDUCTOR DEVICES

BACKGROUND

In the design and packaging of semiconductor integrated circuits (ICs), there are several areas of concern. Moisture needs to be prevented from entering the circuits because: (1) moisture can be trapped in oxides and increase the dielectric constant thereof; (2) moisture can create trapped charge centers in gate oxides causing threshold voltage shifts in complementary metal-oxide-semiconductor (CMOS) transistors; (3) moisture can create interface states at the Si-gate oxide interface causing degradation in the transistor lifetime through increased hot-electron susceptibility; (4) moisture can cause corrosion of the metal interconnect, reducing the reliability of the IC; and (5) when trapped in Si-oxide, moisture can reduce the oxide mechanical strength and the oxide may become more prone to cracking due to tensile stress. Ionic contaminants can also cause damage to the IC as they can diffuse rapidly in silicon oxide. For instance, ionic contaminants can cause threshold voltage instability in CMOS transistors and alter the surface potential of the Si surface in the vicinity of the ionic contaminants. Dicing processes that separate adjacent IC dies from one another may also cause potential damage to the IC.

A seal ring has been used in the industry to protect the IC from moisture degradation, ionic contamination, and dicing processes, but improvement has been desirable. In the course of IC evolution, functional density (i.e., the number of interconnected devices per chip area) has generally increased while geometry size (i.e., the smallest component (or line) that can be created using a fabrication process) has decreased. Such scaling-down has produced a relatively high power dissipation value, which may be addressed by using low power dissipation devices such as CMOS devices. CMOS devices have typically been formed with a gate oxide and polysilicon gate electrode. There has been a desire to replace the gate oxide and polysilicon gate electrode with a high-k gate dielectric and metal gate electrode to improve device performance as feature sizes continue to decrease. However, problems arise when the high-k metal gate, gate last process causes chemical mechanical polishing (CMP) dishing in open areas, such as areas reserved for forming a seal ring around an integrated circuit die.

Accordingly, improved methods of semiconductor device fabrication and devices fabricated by such methods are desired.

SUMMARY

The present disclosure provides for many different embodiments. One of the broader forms of the present disclosure involves a semiconductor device. The semiconductor device includes a substrate having a seal ring region and a circuit region, a plurality of dummy gates disposed over the seal ring region of the substrate, and a seal ring structure disposed over the plurality of dummy gates in the seal ring region.

Another of the broader forms of the present disclosure involves a semiconductor device including a substrate having a seal ring region and a circuit region, and a plurality of dummy polysilicon gates disposed over the seal ring region of the substrate, the plurality of dummy polysilicon gates occupying between about 15% and about 80% of a total surface area of the seal ring region. The device further includes an interlayer dielectric (ILD) disposed between adjacent dummy polysilicon gates in the seal ring region, and a seal ring structure disposed over the plurality of dummy polysilicon gates and the ILD in the seal ring region.

Another of the broader forms of the present disclosure involves a method of fabricating a semiconductor device. The method includes providing a substrate having a seal ring region and a circuit region, forming a plurality of dummy gates over the seal ring region of the substrate, and forming a seal ring structure over the plurality of dummy gates over the seal ring region.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In addition, the present disclosure provides examples of a "gate last" metal gate process, however one skilled in the art may recognize applicability to other processes and/or use of other materials.

Figure 1:
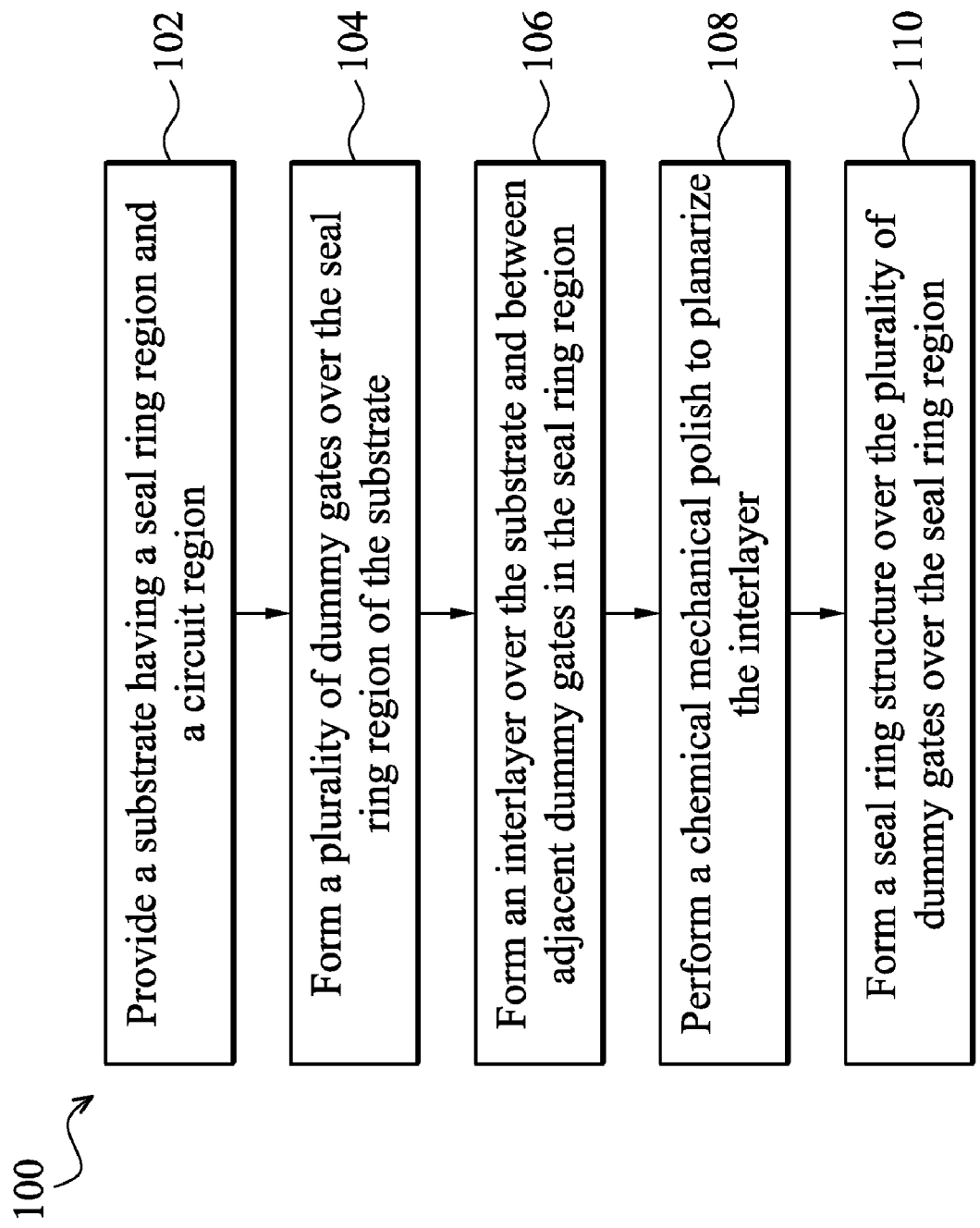
FIG. 1 is a flowchart illustrating a method for fabricating a semiconductor device with a seal ring structure over dummy gates according to various aspects of the present disclosure.
Figure 2:
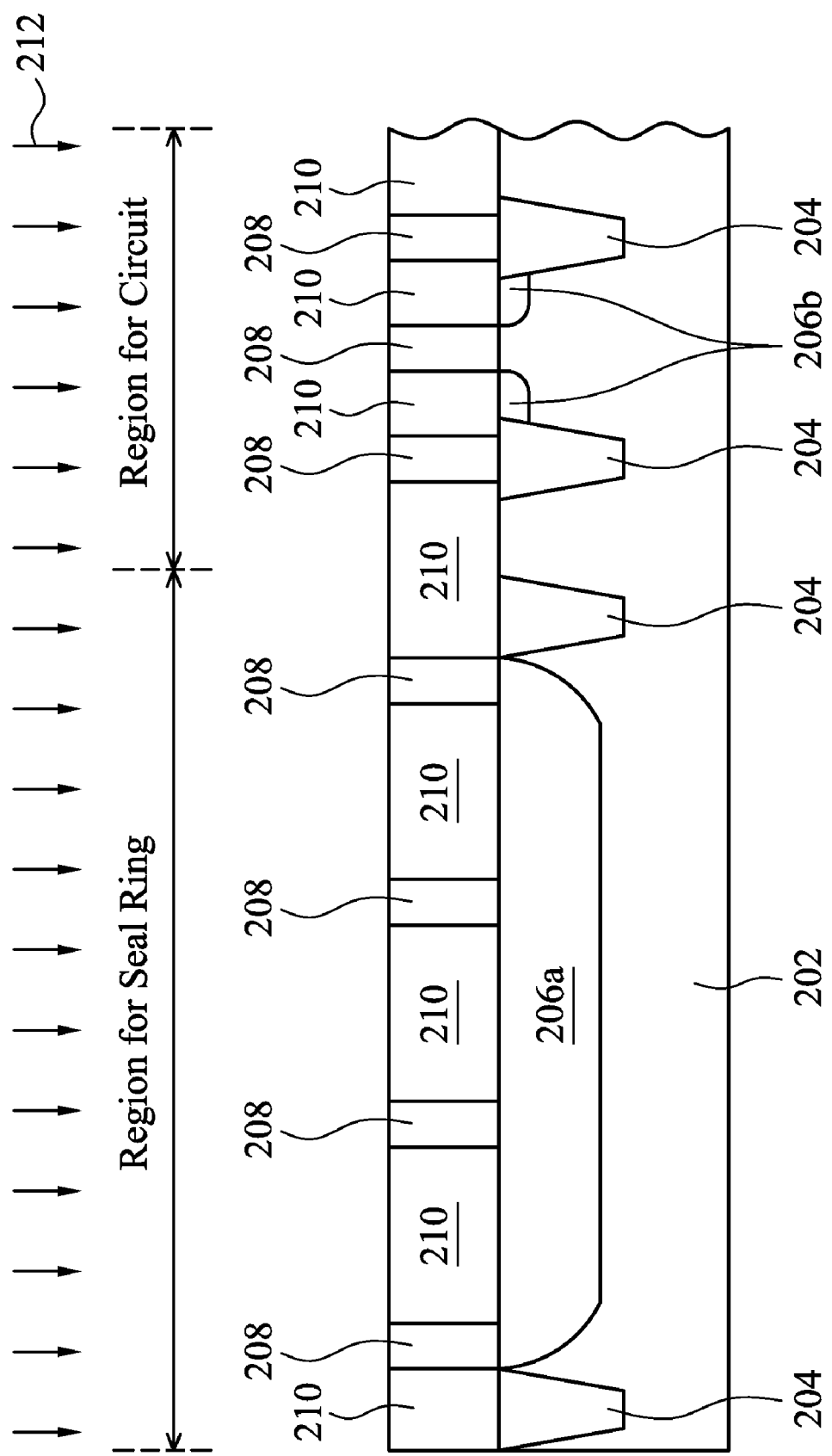
FIG. 2 is a cross-sectional view of an embodiment of a semiconductor device at a stage of fabrication according to the method of FIG. 1.
Figure 3:
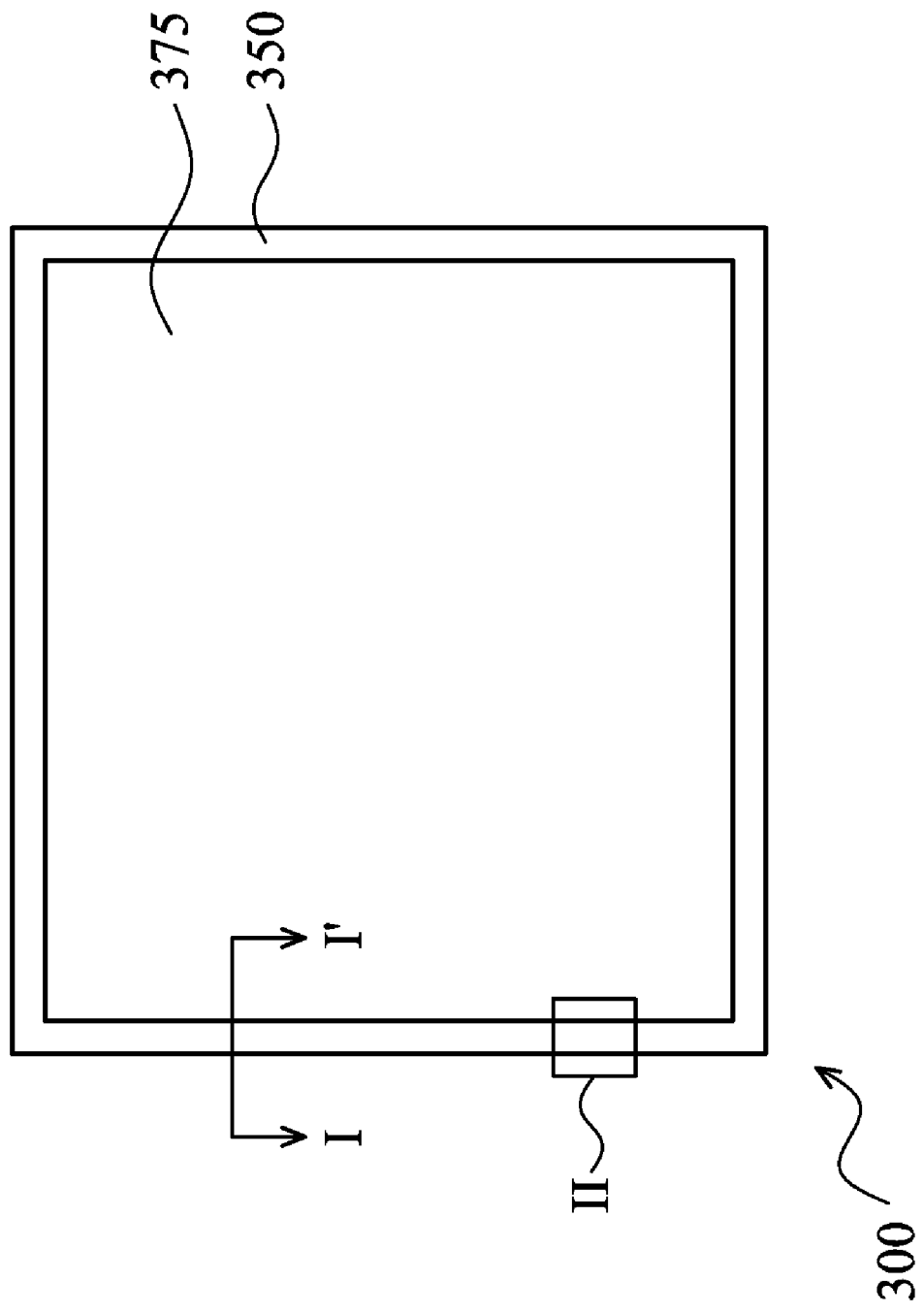
FIG. 3 is a top plan view of an integrated circuit die with a seal ring structure according to various aspects of the present disclosure.
Figures 4A, 4B, 4C:
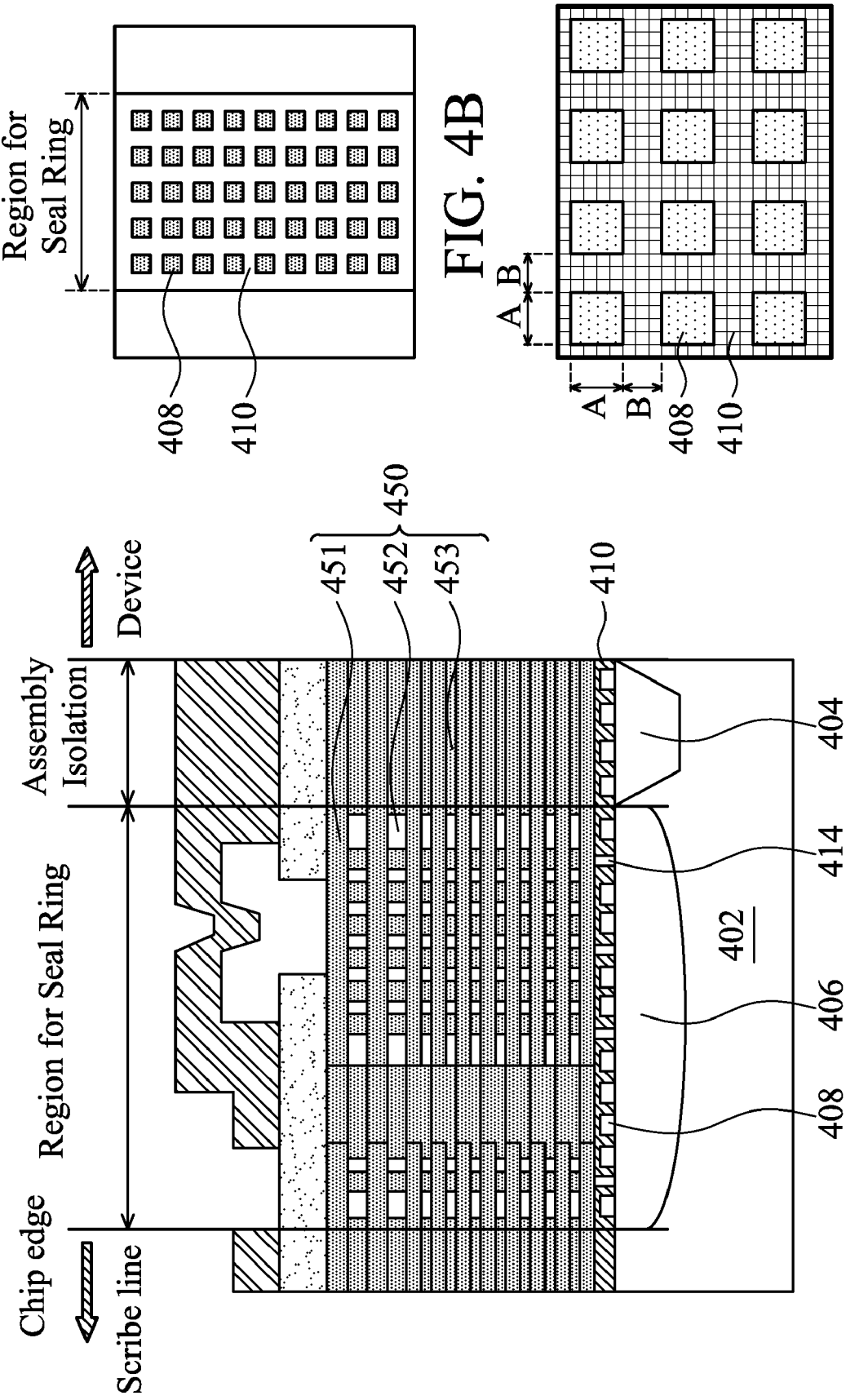
FIGS. 4A-4C are a cross-sectional view of an embodiment of a semiconductor device and top plan views of an embodiment of dummy gates in a seal ring region, respectively, according to various aspects of the present disclosure.
Figure 5B:
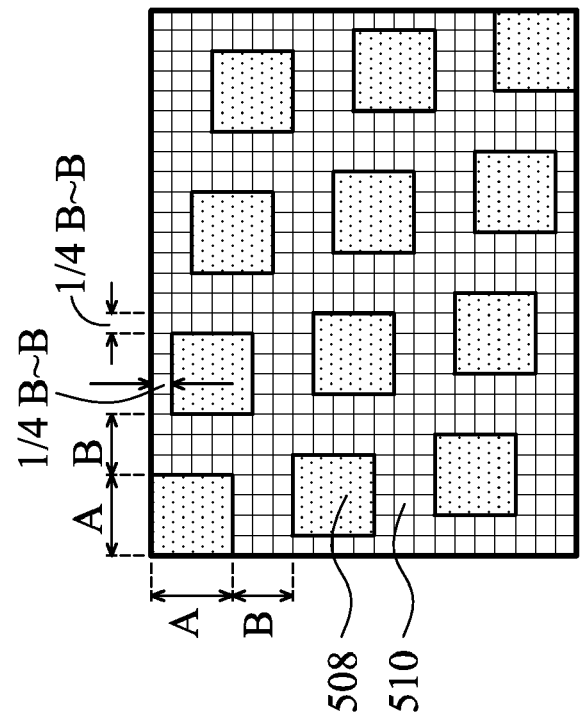
FIGS. 5A and 5B are top plan views of another embodiment of dummy gates in a seal ring region according to various aspects of the present disclosure.
Figure 5A:
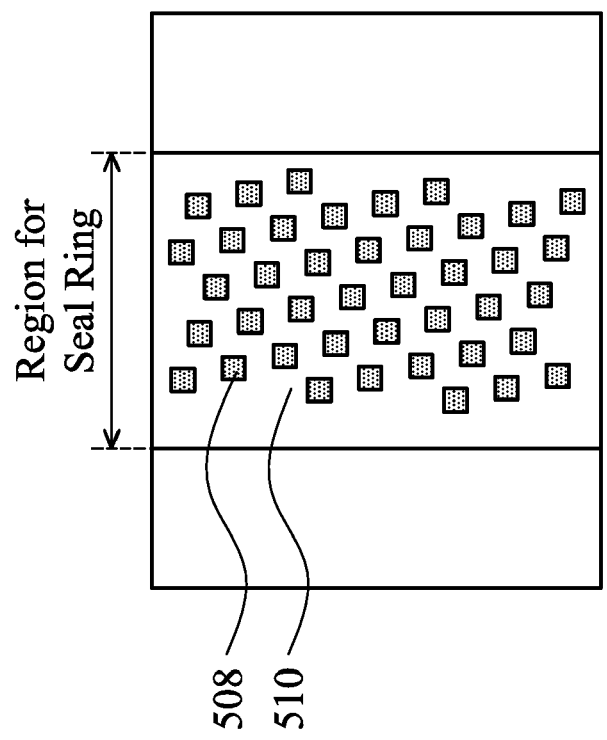
Figure 6B:
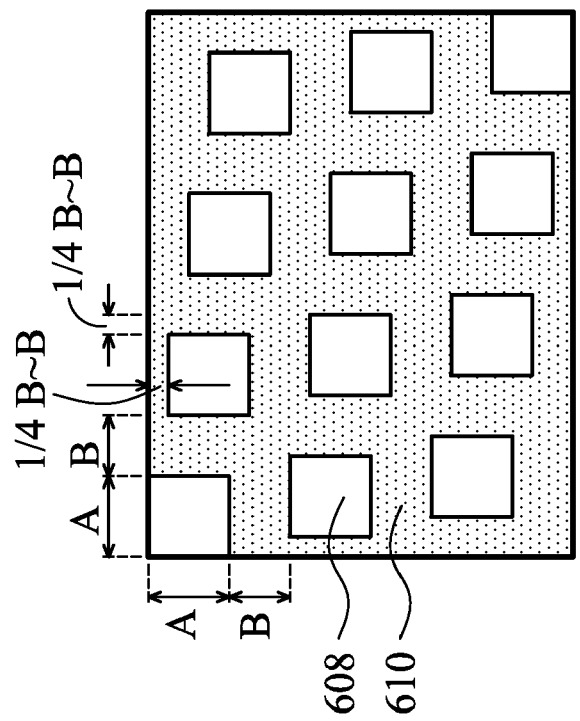
FIGS. 6A and 6B are top plan views of another embodiment of dummy gates in a seal ring region according to various aspects of the present disclosure.
Figure 6A:
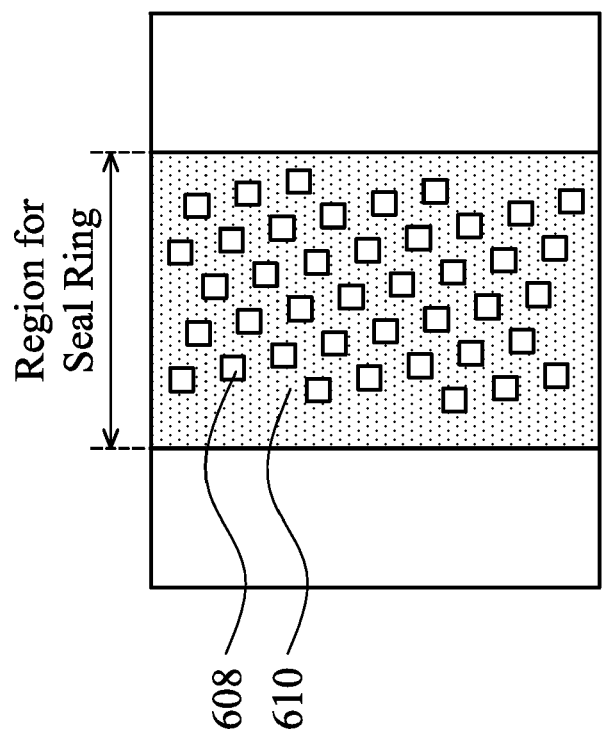
Figures 7A, 7B:
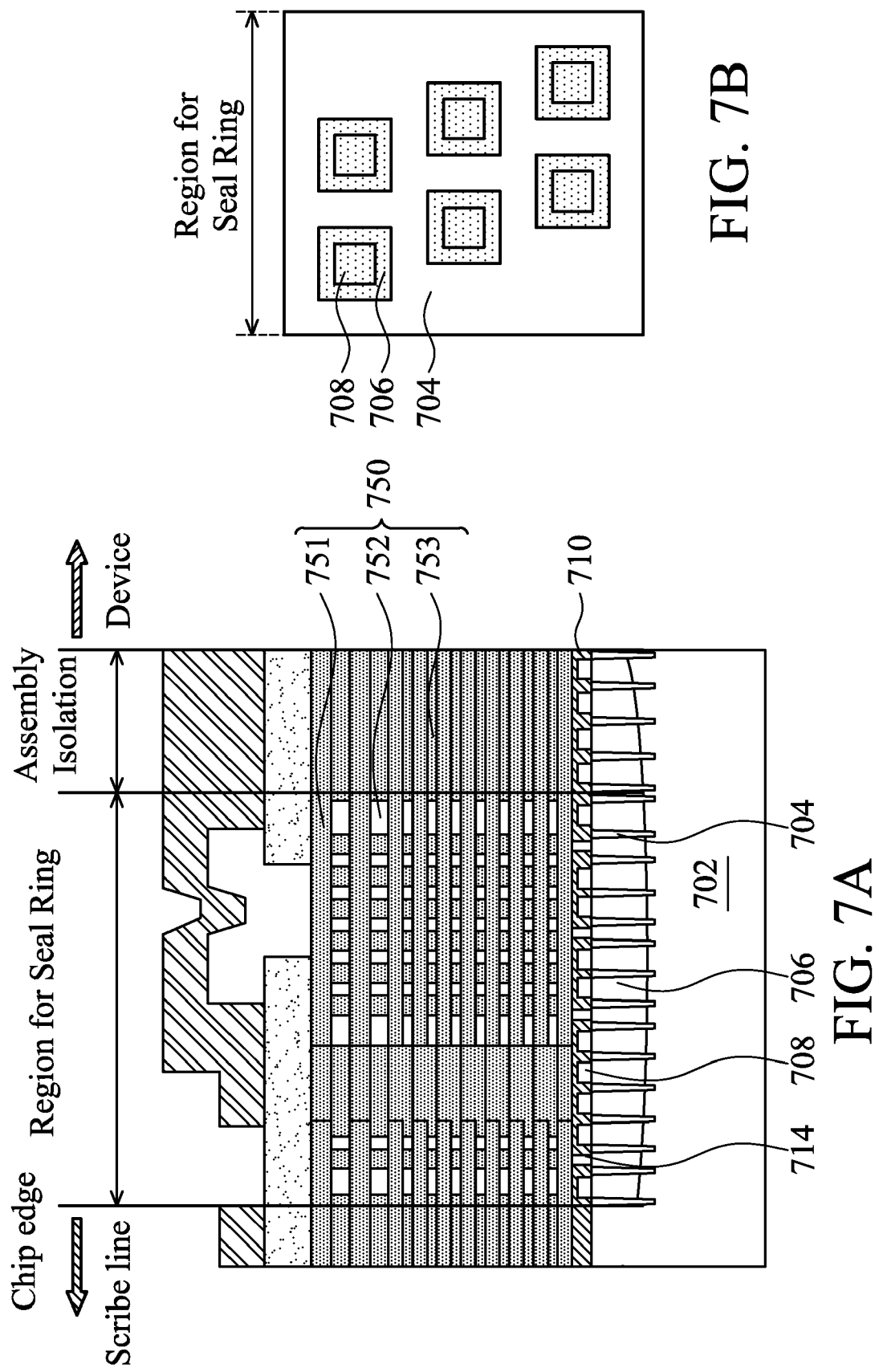
FIGS. 7A and 7B are a cross-sectional view of another embodiment of a semiconductor device and a top plan view of another embodiment of dummy gates in a seal ring region, respectively, according to various aspects of the present disclosure.

Referring to the figures, FIG. 1 illustrates a flowchart of a method 100 for fabricating a semiconductor device with a seal ring structure over dummy gates according to various aspects of the present disclosure. FIG. 2 is a cross-sectional view of an embodiment of a semiconductor device 200 at a stage of fabrication according to the method 100 of FIG. 1. FIG. 3 is a top plan view of a device 300 including an integrated circuit die 375 with a seal ring structure 350 over dummy gates according to various aspects of the present disclosure. FIGS. 4A-4C are a cross-sectional view of an embodiment of a device 300 and top plan views of an embodiment of dummy gates in a seal ring region, respectively, according to various aspects of the present disclosure. FIGS. 5A and 5B are top plan views of another embodiment of dummy gates in a seal ring region according to various aspects of the present disclosure, and FIGS. 6A and 6B are top plan views of yet another embodiment of dummy gates in a seal ring region according to various aspects of the present disclosure. FIGS. 7A and 7B are a cross-sectional view of another embodiment of semiconductor device 300 and a top plan view of another embodiment of dummy gates in a seal ring region, respectively, according to various aspects of the present disclosure. The semiconductor devices 200, 300 and the embodiments of dummy gates in a seal ring region may be similar, and accordingly, similar features are similarly numbered for the sake of simplicity and clarity.

It should be noted that part of the semiconductor devices 200 and 300 may be fabricated with a CMOS process flow. Accordingly, it is understood that additional processes may be provided before, during, and after the method 100 of FIG. 1, and that some other processes may only be briefly described herein. The semiconductor devices 200 and 300 may be fabricated in a gate last process (also referred to as a replacement poly gate process (RPG)). In a gate last process, a dummy gate structure (e.g., formed of polysilicon (or poly)) may be initially formed in both a region for a seal ring and a region for a circuit, and may be followed by a normal CMOS process flow until deposition of an interlayer dielectric (ILD). The dummy poly gate structure in the circuit region may then be removed and replaced with a high-k gate dielectric/metal gate structure.

Referring now to FIG. 1, method 100 begins with block 102 in which a semiconductor substrate is provided having a seal ring region and a circuit region. In an embodiment, the seal ring region is formed around the circuit region, and the seal ring region is for forming a seal ring structure thereon and the circuit region is for forming at least a transistor device therein. The method 100 continues with block 104 in which a plurality of dummy gates are formed over the seal ring region of the substrate. In one example, the dummy gates may be comprised of polysilicon or a dielectric. The method 100 continues with block 106 in which an interlayer is formed over the substrate and between adjacent dummy gate structures. Thereafter, at block 108, a chemical mechanical polishing (CMP) process is performed on the interlayer to planarize the interlayer, in one example until the dummy gates are exposed. In other examples, the interlayer may be planarized without the dummy gates in the seal ring region being exposed. Advantageously, because the dummy gates are formed in the seal ring region of the substrate, dishing from a subsequent CMP process is prevented in the seal ring region. Finally, at block 110, a seal ring structure is formed over the plurality of dummy gates over the seal ring region.

Referring now to FIG. 2, a cross-sectional view of an embodiment of semiconductor device 200 at a stage of fabrication according to the method 100 of FIG. 1 is illustrated. The semiconductor device 200 may include a semiconductor substrate 202 such as a silicon substrate having a seal ring region and a circuit region. In an embodiment, the seal ring region is formed around the circuit region, and the seal ring region is for forming a seal ring structure thereon and the circuit region is for forming at least a transistor device therein. The substrate 202 may alternatively include silicon germanium, gallium arsenic, or other suitable semiconductor materials. The substrate 202 may further include doped active regions (e.g., active regions 206a, 206b) such as a P-well and/or an N-well. The substrate 202 may also further include other features such as a buried layer, and/or an epitaxy layer. Furthermore, the substrate 202 may be a semiconductor on insulator such as silicon on insulator (SOI). In other embodiments, the semiconductor substrate 202 may include a doped epitaxy layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure. The active region may be configured as an NMOS device (e.g., nFET) or a PMOS device (e.g., pFET). The semiconductor substrate 202 may include underlying layers, devices, junctions, and other features (not shown) formed during prior process steps or which may be formed during subsequent process steps.

The device 200 further includes isolation structures 204, such as shallow trench isolation (STI) or LOCOS features formed in the substrate 202 for isolating active regions 206a, 206b from other regions of the substrate 202. The active regions 206b may be configured as an NMOS device (e.g., nFET) or as a PMOS device (e.g., pFET) in one example.

The device 200 further includes multiple dummy gates 208 formed in the seal ring region and multiple dummy gates 208 formed in the circuit region. As should be understood, the plurality of dummy gates 208 in the seal ring region will substantially reduce or eliminate dishing in the seal ring region during CMP processing 212 (as shown by the downward arrows) of the device 200.

The formation of the dummy gates 208 includes forming various material layers, and etching/patterning the various material layers to form a gate structure. In one example, the semiconductor device 200 may include a dummy insulator layer (not shown) formed over the substrate 202. In the alternative, an insulator layer including an interfacial layer, a high k dielectric layer and/or a barrier layer may be formed on the substrate 202 and left in the final device. The insulator layer may be a dummy dielectric layer formed on the substrate 202. The dummy dielectric layer may include an oxide (e.g., thermal or chemical oxide formation) in one example.

The semiconductor device 200 further includes a dummy layer formed over the substrate by a suitable deposition process. In one example, the dummy gates are comprised of polysilicon, and for this case of dummy poly gates, silane ($SiH_4$), di-silane ($Si_2H_6$), or di-clorsilane ($SiCl_2H_4$) may be used as a chemical gas in a CVD process to form the poly dummy layer. The poly dummy layer may include a thickness ranging from about 400 to about 2000 angstrom (A) in one example. Subsequently, using conventional photolithography, patterning, and etching techniques, the dummy layer is patterned and etched to form the plurality of dummy gates 208 over the seal ring region and the circuit region.

In one example, a photoresist (PR) layer and/or a hard mask layer (not shown) may be formed over the substrate 202 and the dummy layer (e.g., comprised of polysilicon). The hard mask layer may include silicon oxide, silicon nitride, silicon oxynitride, silicon carbide, and/or other suitable dielectric materials, and may be formed using a method such as CVD or PVD. Additionally, an antireflective coating layer or bottom antireflective coating (BARC) layer (not shown)

may be used to enhance a photolithography process for patterning a photoresist layer. For example, the patterned photoresist layer may be formed on the hard mask layer including gate patterns. The gate patterns may then be used to pattern the hard mask layer by a dry etch or wet etch process. The patterned hard mask may then be used to form the gate structures by a dry etch, wet etch, or combination dry and wet etch process. Accordingly, the gate structure may include an insulator layer (not shown) and the dummy gate 208. The patterned PR layer may be formed by photolithography, immersion lithography, ion-beam writing, or other suitable techniques. For example, the photolithography process may include spin-coating, soft-baking, exposure, post-baking, developing, rinsing, drying, and other suitable process.

Device 200 further includes an interlayer 210 deposited over the substrate and dummy gates, in one example by a high aspect ratio process (HARP) and/or a high density plasma (HDP) CVD process. In one example, interlayer 210 includes a dielectric and is an oxide. The deposition of the interlayer 210 fills in the gaps between the adjacent dummy gates 208 in the seal ring and circuit regions of the substrate.

Alternatively, in a reverse dummy process as will be described in more detail below, dummy gates 208 in the seal ring region may be comprised of dielectric gate structures instead of poly gate structures and interlayer 210 in the seal ring region may then be comprised of poly instead of a dielectric. Accordingly, in a reverse dummy process, a poly interlayer 210 may be formed in the seal ring region prior to dummy gate formation, and then the dielectric dummy gates 208 may be formed in trenches etched in the poly interlayer 210.

Subsequently, CMP process 212 is performed on the interlayer 210 (an ILD or alternatively a poly layer) to planarize the interlayer 210, in one example but not necessarily until the dummy gates 208 are exposed.

After formation of the dummy gates 208 and interlayer 210, device 200 may undergo additional processing (e.g., CMOS processing) to further include a seal ring structure formed over the plurality of dummy gates over the seal ring region (seal ring embodiments are shown for example in FIGS. 4A and 7A), a high-k gate dielectric/metal gate structure in the circuit region after dummy poly gate structures in the circuit region are removed in a gate last or RPG process, and various other features.

An example of a gate last or RPG process may include forming a PR layer in the seal ring region to protect the dummy gates in the seal ring region, and then removing the dummy gates in the circuit region by a dry etching, wet etching, or combination dry and wet etching process to thereby form trenches. For example, a wet etching process may include exposure to a hydroxide containing solution (e.g., ammonium hydroxide), de-ionized water, and/or other suitable etchant solutions. The dummy poly gate (and/or dummy dielectrics) in the circuit region may be removed in a single-step etching process or multiple-step etching process. For example, a first wet etch process may be used to remove the dummy poly gate, and a second wet etch process may be used to remove the dummy dielectric. The second wet etch process may include exposure to a buffered HF solution or a buffered oxide etchant (BOE). It is understood that other etching chemicals may be used for selectively removing the dummy poly gates and/or dummy dielectrics. Next, a high k gate film and a metal gate layer is formed to substantially fill in the trenches in the circuit region. The high k layers may include an interfacial layer, a high-k dielectric layer, and/or a barrier layer. Additionally, a fill metal is deposited to fill in the trenches. In an embodiment, a layer of titanium (Ti) may be deposited to function as a wetting layer for a subsequent aluminum (Al) fill. The Ti layer may be formed by PVD or other suitable process. A layer of metal, such as Al, may be formed to fill in the trenches. The Al layer may be formed by forming a first Al layer by CVD and then forming a second Al layer by PVD. Alternatively, the fill metal may optionally include tungsten (W), copper (Cu), or other suitable metal material. Subsequently, a CMP process may be performed on the metal gate structures in the circuit region to remove the excess metal, and the CMP may have a high selectivity to provide a substantially planar surface for the gate structure, including removing the PR layer in the seal ring region.

It is understood that the semiconductor device 200 may undergo further processing in the circuit region to form various features such as contacts/vias, interconnect metal layers, interlayer dielectric, passivation layers, etc. to form semiconductor circuits as is known in the art. It should be noted that the techniques and processes, such as lithography, etching, and high-k/metal gate formation, disclosed above with reference to FIG. 2 can also be implemented in the various embodiments disclosed below with reference to FIGS. 3-7B.

Referring now to FIG. 3, a top plan view is illustrated of semiconductor device 300 including integrated circuit die 375 surrounded with seal ring structure 350 over dummy gates in the seal ring region of a substrate. FIGS. 4A and 7A illustrate cross-sectional views of different embodiments of the device 300 along line I-I', and FIGS. 4B-4C, 5A-5B, 6A-6B, and 7B illustrate magnified top plan views of a portion II of device 300.

Referring now to FIGS. 4A-4C, FIG. 4A illustrates a cross-sectional view of an embodiment of semiconductor device 300 along line I-I' in FIG. 3, and FIGS. 4B and 4C illustrate top plan views of portion II in FIG. 3 of an embodiment of the dummy gates in the seal ring region according to various aspects of the present disclosure. Referring in particular to FIG. 4A, the semiconductor device includes a substrate 402 including a seal ring region and isolation structures 404 isolating an active region 406. In one example, active region 406 may include a deep N-well or P-well region, a p+ or n+ source/drain region, and/or a silicide disposed over the source/drain region, formed by conventional techniques in the art. The device further includes a plurality of dummy gates 408 formed on the substrate 402 in the seal ring region, and an interlayer 410 formed between adjacent dummy gates 408. Contact bars 414 are formed between dummy gates 408 to electrically couple active region 406 to a seal ring structure 450 formed over the plurality of dummy gates 408. Seal ring structure 450 may be comprised of various stacked conductive layers 451 and via layers 452 disposed through dielectric layers 453, and may have a width between about 5 microns and about 15 microns in one example. Substrate 402, isolation structures 404, active region 406, dummy gates 408, and interlayer 410 are similar to the structures described above with respect to FIG. 2 and may be formed by similar processes and have similar characteristics and functions as described above. It is noted that other layers may be provided in the seal ring region to form various features over the seal ring structure such as passivation layers, nitride layers, and polyimide layers deposited by CVD, spin-on techniques, and the like.

Referring now in particular to FIGS. 4B-4C, the plurality of dummy gates 408 are formed within interlayer 410 on the seal ring region of substrate 402 in a vertically and horizontally aligned array of dummy gates. In one example, the dummy gates 408 have a square cross-section with a side A, and adjacent dummy gates 408 are spaced apart from one another by a distance B. In one example, distance B may be between about 0.7 A and about 1.4 A. In one example, B may equal A. In yet another example, distance A is about 0.4 micron and the dummy gates 408 are spaced apart from another by distance B of about 0.5 micron. In yet another example, the plurality of dummy gates 408 in the seal ring region is formed in an array occupying between about 15% and about 80% of a total surface area of the seal ring region. In other words, a dummy gate density, defined by the sum of the surface area of the cross-section of each dummy gate divided by the total surface area of the seal ring region of the substrate, is between about 15% and about 80%.

Referring now to FIGS. 5A-5B and 6A-6B, top plan views are illustrated of other embodiments of dummy gates in a seal ring region according to various aspects of the present disclosure. FIGS. 5A and 5B illustrate a plurality of dummy gates 508 formed within interlayer 510 on the seal ring region of a substrate in a vertically and horizontally staggered array of dummy gates. In one example, the dummy gates 508 have a square cross-section with a side A, and adjacent dummy gates 508 are spaced apart from one another by a vertical or horizontal distance B with a vertical and horizontal stagger distance between adjacent dummy gates 508 of about ¼ B to about B. In one example, distance B may be between about 0.7 A and about 1.4 A, such that a vertical and horizontal stagger between adjacent dummy gates 508 is between about 0.175 A and about 1.4 A. In one example, B may equal A. In yet another example, distance A is about 0.4 micron and the dummy gates 408 are spaced apart from another by distance B of about 0.5 micron with a vertical and horizontal stagger distance of about 0.2 micron. In yet another example, the plurality of dummy gates 508 in the seal ring region is formed in an array to have a dummy gate density between about 15% and about 80% of a total surface area of the seal ring region.

FIGS. 6A and 6B illustrate a plurality of dummy dielectric blocks 608 formed within dummy gates 610 on the seal ring region of a substrate in a vertically and horizontally staggered array of dummy gates similar to FIGS. 5A and 5B but in a reverse dummy embodiment. For example, if dummy gates 508 are comprised of polysilicon and interlayer 510 is comprised of a dielectric, dummy dielectric blocks 608 are comprised of a dielectric and dummy gates 610 is comprised of polysilicon, and dummy dielectric blocks 608 and dummy gates 610 may be formed in an opposite order to the formation order of dummy gates 508 and interlayer 510. Similar to the staggered array of dummy gates 508, in one example, the dummy dielectric blocks 608 have a square cross-section with a side A, and adjacent dummy dielectric blocks 608 are spaced apart from one another by a vertical or horizontal distance B with a vertical and horizontal stagger distance between adjacent dummy dielectric blocks 608 of about ¼B to about B. In one example, distance B may be between about 0.7 A and about 1.4 A, such that a vertical and horizontal stagger between adjacent dummy dielectric blocks 608 is between about 0.175 A and about 1.4 A. In one example, B may equal A. Once again, in one example, distance A is about 0.4 micron and the dummy dielectric blocks 608 are spaced apart from another by distance B of about 0.5 micron with a vertical and horizontal stagger distance of about 0.2 micron. In yet another example, the plurality of dummy dielectric blocks 608 in the seal ring region is formed in an array to have a dummy gate density between about 20% and about 85% of a total surface area of the seal ring region.

Referring now to FIGS. 7A and 7B, FIG. 7A illustrates a cross-sectional view of an embodiment of semiconductor device 300 along line I-I' in FIG. 3, and FIG. 7B illustrates a top plan view of portion II in FIG. 3 of another embodiment of the dummy gates in the seal ring region according to various aspects of the present disclosure. The semiconductor device includes a substrate 702 including a seal ring region and isolation structures 704 and an active region 706. Active region 706 may include a deep N-well or P-well region, a p+ or n+ source/drain region, and/or a silicide disposed over the source/drain region, formed by conventional techniques in the art. The device further includes a plurality of dummy gates 708 formed on the substrate 702 in the seal ring region, and an interlayer 710 formed between adjacent dummy gates 708. Contact bars 714 are formed between dummy gates 708 to electrically couple the active region 706 to a seal ring structure 750 formed over the plurality of dummy gates 708. Seal ring structure 750 may be comprised of various stacked conductive layers 751 and via layers 752 disposed through dielectric layers 753, and may have a width between about 5 microns and about 15 microns in one example. Substrate 702, dummy gates 708, and interlayer 710 are similar to the structures described above with respect to FIGS. 2 and 4A and may be formed by similar processes and have similar characteristics and functions as described above. It is noted that other layers may be provided in the seal ring region to form various features over the seal ring structure such as passivation layers, nitride layers, and polyimide layers deposited by CVD, spin-on techniques, and the like. As shown in FIG. 7A, in this embodiment, isolation structures 704 are formed in substrate 702 and active region 706 with an isolation structure 704 between adjacent dummy gates 708. Referring in particular to FIG. 7B, each of the plurality of dummy gates 708 are formed or "landed" on only an active region 706 isolated by isolation structures 704 within the seal ring region of substrate 702. In the embodiment illustrated in FIG. 7B, the array of dummy gates 708 (and corresponding active regions 706) are vertically and horizontally staggered but in other embodiments, the array of dummy gates 708 (and corresponding active regions 706) may be formed in a vertically and horizontally aligned array of dummy gates. In one example, the plurality of dummy gates 708 in the seal ring region is formed in an array to have a dummy gate density between about 15% and about 80% of a total surface area of the seal ring region.

The present disclosure provides for many different embodiments. One of the broader forms of the present disclosure involves a semiconductor device. The semiconductor device includes a substrate having a seal ring region and a circuit region, a plurality of dummy gates disposed over the seal ring region of the substrate, and a seal ring structure disposed over the plurality of dummy gates in the seal ring region.

Another of the broader forms of the present disclosure involves a semiconductor device including a substrate having a seal ring region and a circuit region, and a plurality of dummy polysilicon gates disposed over the seal ring region of the substrate, the plurality of dummy polysilicon gates occupying between about 15% and about 80% of a total surface area of the seal ring region. The device further includes an interlayer dielectric (ILD) disposed between adjacent dummy polysilicon gates in the seal ring region, and a seal ring structure disposed over the plurality of dummy polysilicon gates and the ILD in the seal ring region.

Another of the broader forms of the present disclosure involves a method of fabricating a semiconductor device. The method includes providing a substrate having a seal ring region and a circuit region, forming a plurality of dummy gates over the seal ring region of the substrate, and forming a seal ring structure over the plurality of dummy gates over the seal ring region.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
   a substrate having a seal ring region and a circuit region;
   a plurality of dummy gates disposed over the seal ring region of the substrate and forming an array of vertically and horizontally staggered dummy gates, each dummy gate in the plurality of dummy gates being staggered both vertically and horizontally from every adjacent dummy gate when viewed in a top plan view; and
   a seal ring structure disposed over the plurality of dummy gates in the seal ring region.

2. The semiconductor device of claim 1, wherein the dummy gates are comprised of polysilicon or an interlayer dielectric.

3. The semiconductor device of claim 1, wherein the seal ring structure is comprised of a metal stack disposed around the circuit region.

4. The semiconductor device of claim 1, wherein the plurality of dummy gates in the seal ring region is formed in an array occupying between about 15% and about 80% of a total surface area of the seal ring region.

5. The semiconductor device of claim 1, wherein each dummy gate in the plurality of dummy gates has a square cross-section when viewed in the top plan view with a side A, and wherein the vertical and horizontal stagger between adjacent dummy gates is between about 0.175 A and about 1.4 A when viewed in the top plan view.

6. The semiconductor device of claim 1, further comprising a shallow trench isolation feature formed in the seal ring region between adjacent dummy gates.

7. The semiconductor device of claim 1, further comprising a polysilicon layer or an interlayer dielectric (ILD) disposed between adjacent dummy gates in the seal ring region, wherein the polysilicon layer or the ILD is planarized using a chemical mechanical polishing (CMP) process.

8. A semiconductor device, comprising:
   a substrate having a seal ring region and a circuit region;
   a plurality of dummy polysilicon gates disposed over the seal ring region of the substrate, the plurality of dummy polysilicon gates occupying between about 15% and about 80% of a total surface area of the seal ring region and forming an array of vertically and horizontally staggered dummy gates, each dummy polysilicon gate in the plurality of dummy polysilicon gates being staggered both vertically and horizontally from every adjacent dummy polysilicon gate when viewed in a top plan view;
   an interlayer dielectric (ILD) disposed between adjacent dummy polysilicon gates in the seal ring region; and
   a seal ring structure disposed over the plurality of dummy polysilicon gates and the ILD in the seal ring region.

9. The semiconductor device of claim 8, wherein the seal ring structure is comprised of a metal stack disposed around the circuit region.

10. The semiconductor device of claim 8, wherein each dummy polysilicon gate has a square cross-section with a side A when viewed in the top plan view, and wherein the vertical and horizontal stagger between adjacent dummy polysilicon gates is between about 0.175 A and about 1.4 A when viewed in the top plan view.

11. The semiconductor device of claim 8, further comprising a shallow trench isolation feature formed in the seal ring region between adjacent dummy polysilicon gates.

12. A method of fabricating a semiconductor device, the method comprising:
   providing a substrate having a seal ring region and a circuit region;
   forming a plurality of dummy gates over the seal ring region of the substrate, the plurality of dummy gates forming an array of vertically and horizontally staggered dummy gates, and each dummy gate in the plurality of dummy gates being staggered both vertically and horizontally from every adjacent dummy gate when viewed in a top plan view; and
   forming a seal ring structure over the plurality of dummy gates over the seal ring region.

13. The method of claim 12, wherein the seal ring structure comprises a metal stack, and the dummy gate is comprised of polysilicon or an interlayer dielectric.

14. The method of claim 12, wherein the plurality of dummy gates in the seal ring region is formed in an array occupying between about 15% and about 80% of a total surface area of the seal ring region.

15. The method of claim 12, wherein each dummy gate in the plurality of dummy gates has a square cross-section with a side A when viewed in the top plan view, and wherein the vertical and horizontal stagger between adjacent dummy gates is between about 0.175 A and about 1.4 A when viewed in the top plan view.

16. The method of claim 12, further comprising forming a shallow trench isolation feature in the substrate between adjacent dummy gates in the seal ring region.

17. The method of claim 12, further comprising:
   forming a polysilicon layer or an interlayer dielectric (ILD) between adjacent dummy gates in the seal ring region; and
   performing a chemical mechanical polish on the polysilicon layer or the ILD in the seal ring region.

18. The semiconductor device of claim 6,
   further including a plurality of spaced active regions formed in the seal ring region and isolated by the shallow trench isolation feature; and
   wherein each dummy gate in the plurality of dummy gates is formed entirely on one of the active regions in the plurality of spaced active regions.

19. The semiconductor device of claim 11,
   further including a plurality of spaced active regions formed in the seal ring region and isolated by the shallow trench isolation feature; and
   wherein each dummy polysilicon gate in the plurality of dummy polysilicon gates is formed entirely on one of the active regions in the plurality of spaced active regions.

20. The method of claim 16,
   further including forming a plurality of spaced active regions in the seal ring region and isolated by the shallow trench isolation feature; and
   wherein forming the plurality of dummy gates includes forming each dummy gate in the plurality of dummy polysilicon gates entirely on one of the active regions in the plurality of spaced active regions.

* * * * *